(12) United States Patent
Wu (10) Patent No.: US 6,746,915 B2
(45) Date of Patent: Jun. 8, 2004

(54) STACK-TYPE DRAM MEMORY STRUCTURE AND ITS MANUFACTURING METHOD

(75) Inventor: Ching-Yuan Wu, Hsinchu (TW)

(73) Assignee: Intelligent Sources Development Corp., Hsinchu (TW)

( * ) Notice: Subject to any disclaimer, the term of this patent is extended or adjusted under 35 U.S.C. 154(b) by 13 days.

(21) Appl. No.: 10/196,273

(22) Filed: Jul. 17, 2002

(65) Prior Publication Data

US 2004/0012022 A1 Jan. 22, 2004

(51) Int. Cl.[7] .......................................... H01L 21/8242
(52) U.S. Cl. ..................... 438/253; 438/240; 438/262; 438/396; 438/398; 438/672; 438/755; 257/296; 257/300; 257/303; 257/306; 257/309
(58) Field of Search ................................ 438/240, 243, 438/253, 256, 255, 262, 394, 396, 398, 399, 672, 755, FOR 163, FOR 175, FOR 190; 257/300, 303, 304, 306, 307, 309, 296

(56) References Cited

U.S. PATENT DOCUMENTS

| | | | | |
|---|---|---|---|---|
| 4,864,374 A | * | 9/1989 | Banerjee | 257/68 |
| 5,229,326 A | * | 7/1993 | Dennison et al. | 438/586 |
| 5,998,225 A | * | 12/1999 | Crenshaw et al. | 438/3 |
| 6,236,079 B1 | * | 5/2001 | Nitayama et al. | 257/306 |
| 6,297,525 B1 | | 10/2001 | Parekh et al. | |
| 6,329,684 B1 | | 12/2001 | Parekh et al. | |
| 6,352,896 B1 | | 3/2002 | Liu et al. | |
| 6,436,762 B1 | * | 8/2002 | Tzeng et al. | 438/253 |
| 6,555,891 B1 | * | 4/2003 | Furukawa et al. | 257/505 |

* cited by examiner

Primary Examiner—George Fourson
Assistant Examiner—Joannie Adelle Garcia
(74) Attorney, Agent, or Firm—Pro-Techtor International Services (57) ABSTRACT

The stack-type DRAM memory structure of the present invention comprises a plurality of self-aligned thin third conductive islands over shallow heavily-doped source diffusion regions without dummy transistors to obtain a cell size of $6F^2$ or smaller; a rectangular tube-shaped cavity having a conductive island formed above a nearby transistor-stack being formed over each of the self-aligned thin third conductive islands to offer a larger surface area for forming a high-capacity DRAM capacitor of the present invention; a planarized third conductive island being formed between a pair of first sidewall dielectric spacers and on each of shallow heavily-doped common-drain diffusion regions to offer a larger contact area and a higher contact integrity; and a plurality of planarized conductive contact-islands being formed over the planarized third conductive islands to eliminate the aspect-ratio effect and being patterned and etched simultaneously with a plurality of bit lines.

20 Claims, 10 Drawing Sheets

STACK-TYPE DRAM MEMORY STRUCTURE AND ITS MANUFACTURING METHOD

BACKGROUND OF THE INVENTION

1. Field of the Invention

The present invention relates generally to a DRAM memory cell and its manufacturing method and, more particularly, to a high-density stack-type DRAM memory structure and its manufacturing method.

2. Description of Related Art

The dynamic-random-access memory (DRAM) cell including an access transistor and a storage capacitor has become the most important storage element in semiconductor industries, especially in computer and communication system. The memory density is increased very rapidly in order to decrease the cost per bit and, therefore, an advanced photolithography is needed to decrease the minimum-feature-size (F) of a cell.

In general, the output voltage of a DRAM memory cell is proportional to the capacitance value of the storage capacitor of the DRAM cell and, therefore, the storage capacitor must have a satisfactory capacitance value to have stable operation of the cell as the applied voltage is scaled. Basically, the storage capacitor can be implemented in a trench type or a stack-type. The trench type is formed by forming a deep trench in a semiconductor substrate without increasing the surface area of the semiconductor-substrate surface; however, the deep-trench formation becomes very difficult as the minimum-feature-size is smaller than 0.15 $\mu$m. The stack-type is formed by implementing a capacitor structure over the access transistor and its nearby dummy-transistor structure through the conductive contact-plug over the node diffusion region of the access transistor; however, the finite surface area over the access transistor becomes very difficult for forming a complicate capacitor structure as the minimum-feature-size is smaller than 0.15 $\mu$m too. Accordingly, the limit cell size of the stack-type is $8F^2$ for shallow-trench-isolation and, in general, the practical cell size is between $8F^2$ and $12F^2$. The limit cell size of the trench type is $6F^2$ for the excess transistor being formed over the semiconductor surface and, in general, the practical cell size is between $6F^2$ and $10F^2$.

Figure 1:
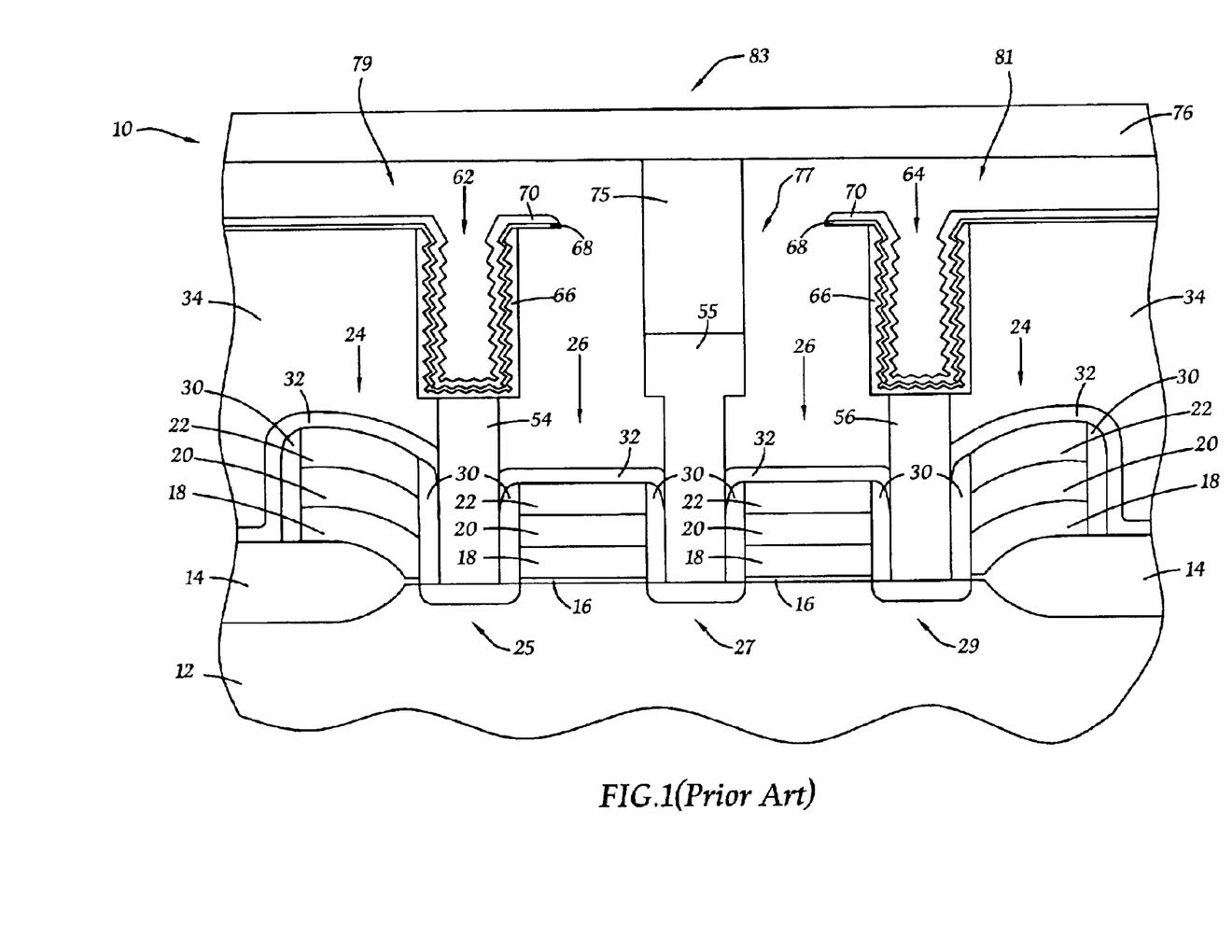
FIG. 1 shows a typical schematic diagram of a stack-type DRAM memory of the prior art.

A typical example of a stack-type DRAM memory is shown in FIG. 1, in which a pair of transistor-stacks 26 are formed over an active region including a common-drain diffusion region 27 and two common-source diffusion regions 25, 29, and a pair of dummy-transistors 24 are formed over the field-oxide layers 14 surrounding the active region. It is clearly seen that the alignment of the two dummy-transistors 24 to the edges of the active region is critical, the lateral dimension of the cell should be larger than 4F; the alignment of the bit-line contact 55 to the common-drain diffusion region 27 between a pair of sidewall dielectric spacers 30 is also critical, the space between two transistor-stacks needs to be larger than 1F; Similarly, the alignment of the node contact 54 is critical too, the space between the transistor-stack 26 and the dummy-transistor 24 needs to be larger than 1F. As a consequence, the cell size of FIG. 1 would be larger than $10F^2$ for isolation using local-oxidation of silicon (LOCOS), and these basic disadvantages can be easily found from most of the DRAM structure of the prior art, for examples: U.S. Pat. No. 6,297,525 B1, U.S. Pat. No. 6,329,684 B1, and U.S. Pat. No. 6,352,896 B1.

It is, therefore, a major objective of the present invention to offer a stack-type DRAM memory structure without dummy-transistors for obtaining a cell size of $6F^2$ or smaller.

It is another objective of the present invention to offer a high-capacity DRAM capacitor structure without using a larger semiconductor surface area.

SUMMARY OF THE INVENTION

Accordingly, the present invention discloses a high-density stack-type DRAM memory structure and its manufacturing method. The stack-type DRAM memory structure of the present invention comprises a DRAM transistor structure and a DRAM capacitor structure. The DRAM transistor structure of the present invention comprises a plurality of transistor-stacks being formed transversely to the plurality of STI regions and over a shallow-trench-isolation (STI) structure having a plurality of STI regions and a plurality of active regions formed alternately on a semiconductor substrate of a first conductivity type, wherein each of the plurality of transistor-stacks comprises an elongated second conductive layer being formed over a flat surface alternately formed by a first conductive layer over a gate-dielectric layer in each of the plurality of active regions and a first raised field-oxide layer in each of the plurality of STI regions, a capping-oxide layer being formed on the elongated second conductive layer, and a second masking dielectric layer being formed over the capping-oxide layer; a plurality of common-source regions and a plurality of common-drain regions being formed alternately and transversely to the plurality of STI regions, wherein each of the plurality of common-source regions comprises two source regions separated by a self-aligned STI region. Each of the plurality of common-drain regions comprises a second flat bed being formed alternately by a third raised field-oxide layer and a common-drain diffusion region of a second conductivity type, a plurality of planarized third conductive islands being formed between a pair of first sidewall dielectric spacers and on the common-drain diffusion regions, a buffer-dielectric layer being formed over one sidewall of each of the plurality of transistor-stacks with a portion under each of the pair of first sidewall dielectric spacers, and a second planarized dielectric layer being formed between the planarized third conductive islands, wherein the common-drain diffusion region comprises a lightly-doped common-drain diffusion region being formed by implanting doping impurities across the buffer-dielectric layer outside of sidewall buffer-dielectric layers in a self-aligned manner and a shallow heavily-doped common-drain diffusion region being formed by implanting doping impurities in a self-aligned manner across the buffer-dielectric layer outside of the pair of first sidewall dielectric spacers. The source region comprises a first flat bed being formed alternately by a third raised field-oxide layer and a source diffusion region of the second conductivity type, a buffer-dielectric layer being formed over another sidewall of each of the plurality of transistor-stacks with a portion under each of the pair of first sidewall dielectric spacers, a thin third conductive island being formed over the source diffusion region between the first sidewall dielectric spacer and the first planarized dielectric layer being formed over said self-aligned STI region; and a second sidewall dielectric-spacer island being formed over each of the thin third conductive islands and between two second planarized dielectric layers formed over the nearby STI regions, wherein the source diffusion region comprises a lightly-doped source diffusion region being formed by implanting doping impurities across the buffer-dielectric layer outside of the sidewall buffer-dielectric layer in a self-aligned manner and a shallow heavily-doped source diffusion region being formed by implanting doping impurities in a self-aligned manner across the buffer-dielectric layer outside of the first sidewall dielectric spacer.

The DRAM capacitor structure of the present invention comprises a plurality of rectangular tube-shaped cavities being formed over the thin third conductive islands and a plurality of bit lines being connected with the planarized third conductive islands through a plurality of planarized conductive contact-plugs or a plurality of planarized conductive contact-islands. The first side of the rectangular tube-shaped cavity is formed by a first sidewall dielectric spacer and a fourth conductive island over a first interlayer-dielectric island being formed on the nearby transistor-stack and a portion of the first sidewall dielectric spacer, a second side being an opposite side of the first side is formed by a third planarized dielectric layer over the first planarized dielectric layer in the self-aligned STI region, and a third side and a fourth side are separately formed by a fourth planarized dielectric layer over the second planarized dielectric layer in the STI region. A fifth conductive layer is formed over an inner sidewall of the rectangular tube-shaped cavity and an outer sidewall of the fourth conductive island over a first interlayer-dielectric island together with the thin third conductive island being acted as a source plate, a capacitor-dielectric layer is formed at least over the source plate, and a sixth conductive layer or a planarized sixth conductive layer is formed over the capacitor-dielectric layer to act a ground plate.

The cell size of the DRAM memory structure as described can be made to be smaller than $6F^2$ and the DRAM capacitor structure may offer a larger surface area for forming a high-capacity DRAM capacitor.

DETAILED DESCRIPTION OF THE PREFERRED EMBODIMENTS

Figure 2A:
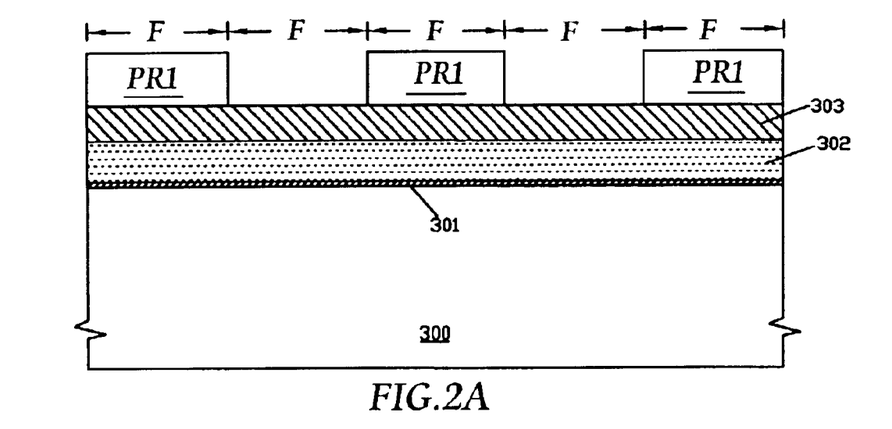
FIG. 2A through FIG. 2F show the process steps and their cross-sectional views of fabricating a shallow-trench-isolation structure for a high-density DRAM memory structure of the present invention.

Referring now to FIG. 2A through FIG. 2F, there are shown the process steps and their cross-sectional views of fabricating a shallow-trench-isolation (STI) structure for a high-density DRAM memory structure of the present invention. FIG. 2A shows that a gate-dielectric layer 301 is formed over a semiconductor substrate 300 of a first conductivity type; a first conductive layer 302 is then formed over the gate-dielectric layer 301; a first masking dielectric layer 303 is subsequently formed over the first conductive layer 302; and a plurality of masking photoresist PR1 are formed over the first masking dielectric layer 303 to define a plurality of active regions (under PR1) and a plurality of shallow-trench-isolation (STI) regions (outside of PR1). The gate-dielectric layer 301 is preferably a thermal-oxide layer or a nitrided thermal-oxide layer and its thickness is preferably between 15 Angstroms and 150 Angstroms. The first conductive layer 302 is preferably made of doped polycrystalline-silicon or doped amorphous-silicon as deposited by low-pressure chemical-vapor-deposition (LPCVD) and its thickness is preferably between 500 Angstroms and 2000 Angstroms. The first masking dielectric layer 303 is preferably made of silicon-nitride as deposited by LPCVD and its thickness is preferably between 500 Angstroms and 2000 Angstroms. The width and the space of the plurality of masking photoresist PR1 can be defined to be a minimum-feature-size (F) of technology used.

Figure 2B:
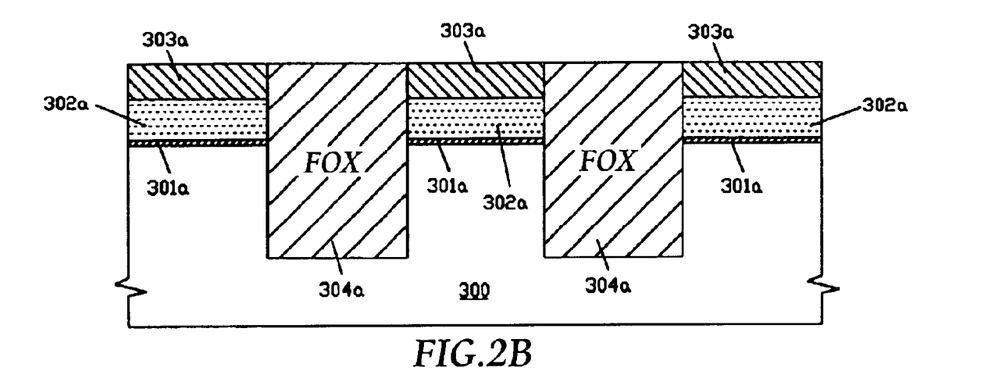

FIG. 2B shows that the first masking dielectric layer 303, the first conductive layer 302, and the gate-dielectric layer 301 outside of the plurality of masking photoresist PR1 are sequentially removed by using anisotropic dry etching; the semiconductor substrate 300 is then anisotropically etched to form the shallow trenches; and subsequently, the plurality of masking photoresist PR1 are stripped and then the planarized field-oxide layer 304a is formed over each gap formed by the shallow trenches. The depth of the shallow trenches in the semiconductor substrate 300 is preferably between 3000 Angstroms and 10000 Angstroms. The planarized field-oxide layer 304a is preferably made of silicon-dioxide, phosphosilicate glass (P-glass), or boro-phosphosilicate glass (BP-glass) as deposited by high-density plasma (HDP) CVD or plasma-enhanced (PE) CVD, and is formed by first depositing a thick-oxide film 304 to fill up the gaps formed by the shallow trenches and then planarizing the deposited thick-oxide film 304 by using chemical-mechanical-polishing (CMP) with the first masking dielectric layer 303a as a polishing stop.

Figure 2C:
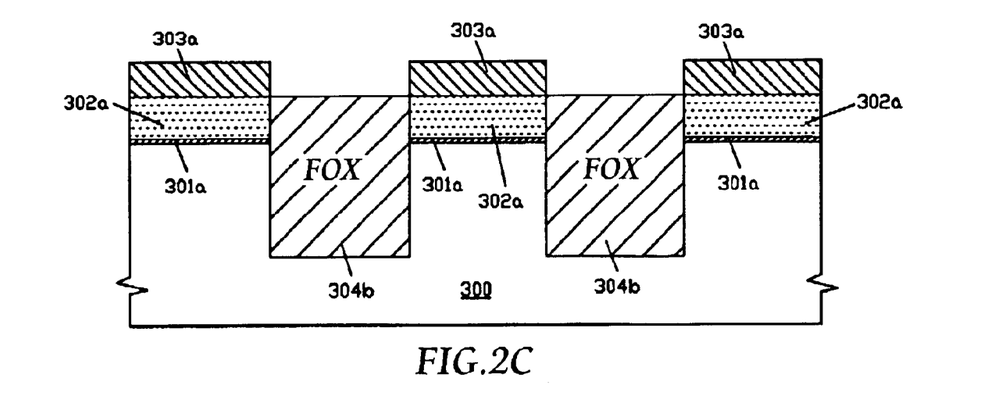

FIG. 2C shows that the planarized field-oxide layers 304a are selectively etched back to a depth equal to a thickness of the first masking dielectric layer 303a to form first raised field-oxide layers 304b.

Figure 2D:
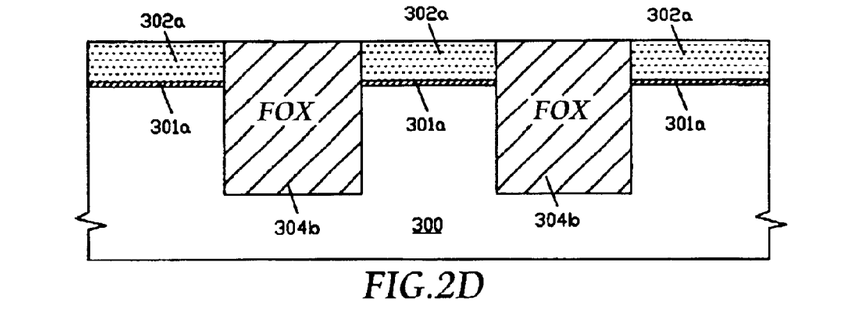

FIG. 2D shows that the first masking dielectric layers 303a are removed preferably by using hot-phosphoric acid or anisotropic dry etching to form a flat surface being alternately formed by the first raised field-oxide layer 304b and the first conductive layer 302a. It should be emphasized that a thermal oxidation process can be performed before forming the planarized field-oxide layers 304a to form a thin thermal-oxide layer over the trenched semiconductor surface for eliminating the trench-induced defects. Moreover, the flat surface shown in FIG. 2C can be obtained by using a silicon-oxide layer as the first masking dielectric layer 303 or without the first masking dielectric layer 303 as a polishing stop.

Figure 2E:
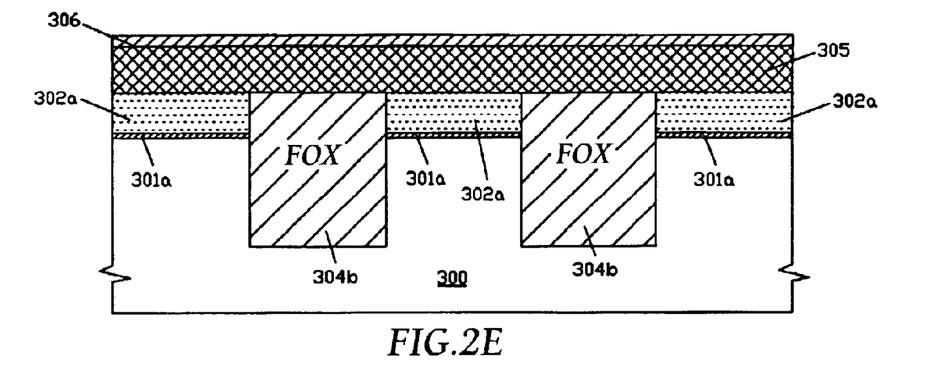

FIG. 2E shows that a second conductive layer 305 is formed over the flat surface shown in FIG. 2D and then a capping-oxide layer 306 is formed over the second conductive layer 305. The second conductive layer 305 is preferably a tungsten-disilicide ($WSi_2$) layer or a tungsten (W) layer as deposited by LPCVD or sputtering and its thickness is preferably between 1500 Angstroms and 3000 Angstroms. The capping-oxide layer 306 is preferably made of silicon-dioxide or silicon-oxynitride as deposited by LPCVD and its thickness is preferably between 100 Angstroms and 2000 Angstroms.

Figure 2F:
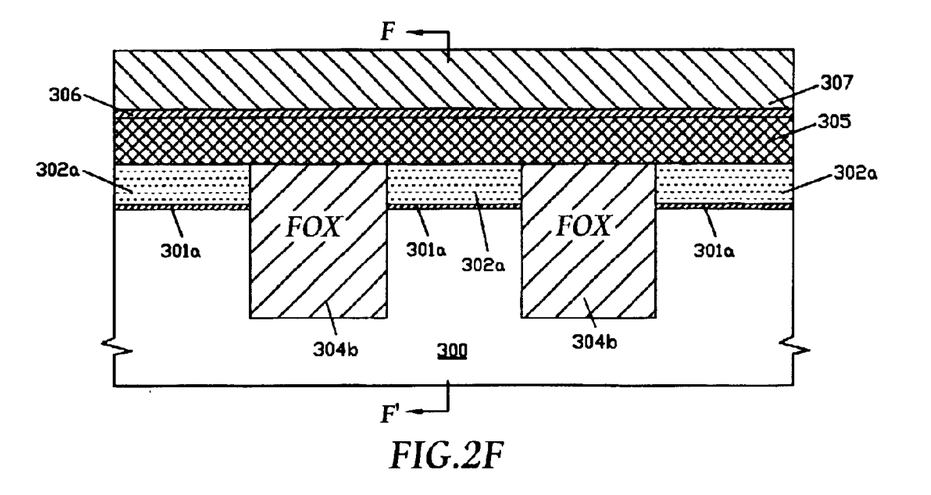

FIG. 2F shows that a second masking dielectric layer 307 is formed over the capping-oxide layer 306. The second masking dielectric layer 307 is preferably made of silicon-nitride as deposited by LPCVD and its thickness is preferably between 1000 Angstroms and 5000 Angstroms. The cross-sectional view along an active region as indicated by the F-F' line is shown in FIG. 3A.

Figure 3A:
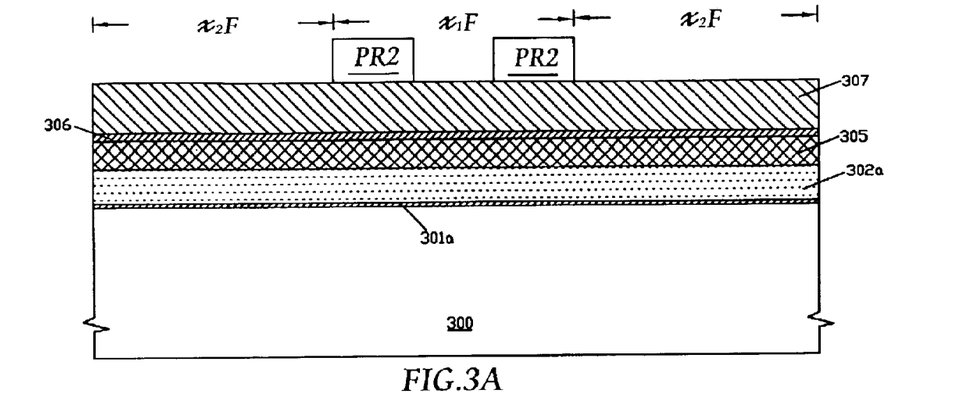
FIG. 3A through FIG. 3H show the process steps and their cross-sectional views of fabricating a DRAM transistor structure of the present invention over the shallow-trench-isolation structure shown in FIG. 2F.

Referring now to FIG. 3A through FIG. 3H, there are shown the process steps and their cross-sectional views of fabricating a DRAM transistor structure over a shallowtrench-isolation structure shown in FIG. 2F. FIG. 3A shows that a plurality of masking photoresist PR2 being formed transversely to the plurality of STI regions are formed over the second masking dielectric layer 307 to define the transistor-stack regions (under PR2), the common-drain regions (between PR2), and the common-source regions (outside of PR2) as marked by $X_2F$. It should be noted that the two transistor-stack regions and the common-drain region is defined to be $X_1F$, the unit cell size of a DRAM cell is $(X_1+X_2) F^2$. If the transistor gate-length and the common-drain region are separately defined to be a minimum-feature-size (F) of technology used, $X_1$ is equal to 3; if the common-source region is defined to 3F ($X_2=3$), the unit cell size is equal to $6F^2$. It will be seen later that the common-source region can be defined to be smaller than 3F and, therefore, the unit cell size of a DRAM cell can be made to be smaller than $6F^2$.

Figure 3B:
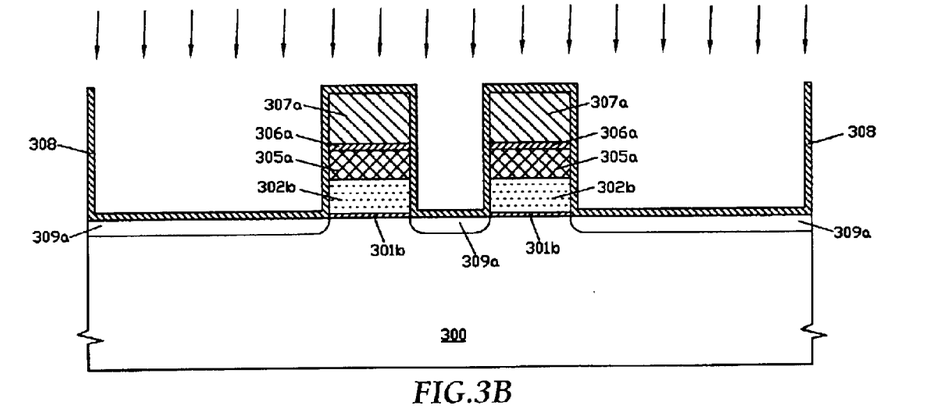

FIG. 3B shows that the second masking dielectric layer 307, the capping-oxide layer 306, the second conductive layer 305 outside of the plurality of masking photoresist PR2 are sequentially removed by using anisotropic dry etching, the first raised field-oxide layers 304b are then etched back to a depth equal to a thickness of the first conductive layer 302 to form second raised field-oxide layers 304c (not shown) and the first conductive layer 302a is then removed in a self-aligned manner, and subsequently, the gate-dielectric layer 301a is removed by dipping in dilute hydrofluoric acid or using anisotropic dry etching and the second raised field-oxide layers 304c are simultaneously etched to form third raised field-oxide layers 304d(not shown). FIG. 3B also shows that a buffer-dielectric layer 308 is formed over the formed structure and an ion-implantation is preformed by implanting doping impurities across the buffer-dielectric layer 308 into the semiconductor substrate 300 of the active regions in a self-aligned manner to form lightly-doped common-source/drain diffusion regions 309a of a second conductivity type. The buffer-dielectric layer 308 is preferably made of silicon-nitride as deposited by LPCVD and its thickness is preferably between 100 Angstroms and 500 Angstroms. It is clearly seen that the buffer-dielectric layer 308 may create an extending length for lightly-doped common-source/drain diffusion regions 309a to reduce the overlapping capacitances between the conductive gate 305a/302b and the lightly-doped common-source/drain diffusion regions 309a.

Figure 3C:
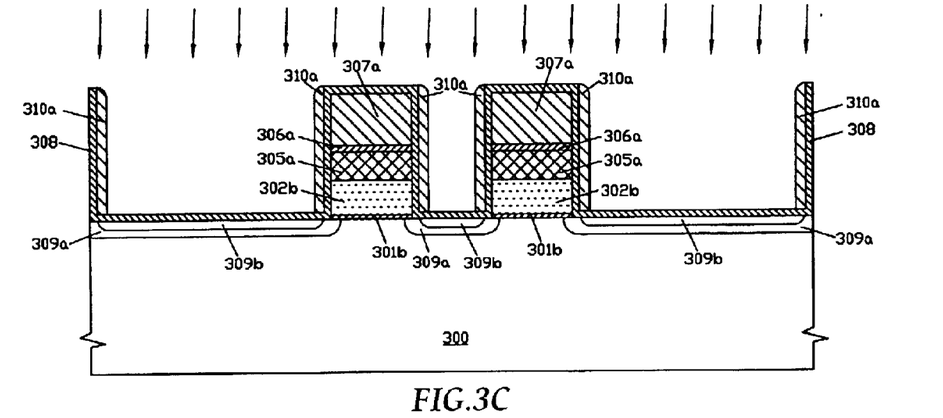

FIG. 3C shows that a first sidewall dielectric spacer 310a is formed over each sidewall of the buffer-dielectric layers 308 and on the buffer-dielectric layer 308 and an ion-implantation is then preformed by implanting doping impurities across the buffer-dielectric layer 308 outside of the first sidewall dielectric spacers 310a into the semiconductor substrate 300 of the active regions in a self-aligned manner to form heavily-doped common-source/drain diffusion regions 309b of the second conductivity type within the lightly-doped common-source/drain diffusion regions 309a. The first sidewall dielectric spacer 310a is preferably made of silicon-nitride as deposited by LPCVD and is formed by first depositing a first dielectric layer 310 over the whole structure surface and then etching back a thickness of the deposited first dielectric layer 310. The spacer width of the first sidewall dielectric spacer 310a is preferably between 100 Angstroms and 1000 Angstroms and is mainly controlled by the thickness of the deposited first dielectric layer 310.

Figure 3D:
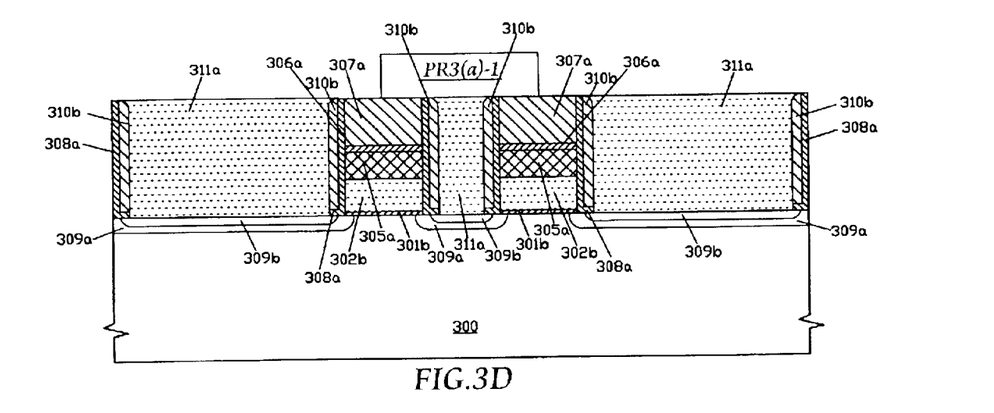

FIG. 3D shows that the buffer-dielectric layer 308 over the second masking dielectric layers 307a and outside of the first sidewall dielectric spacers 310a are removed by anisotropic dry etching or wet-etching to form dielectric layers 308a and the first sidewall dielectric spacers 310a are simultaneously etched; the planarized third conductive layers 311a are then formed over the third raised field-oxide layers 304d and the heavily-doped common-source/drain diffusion regions 309b between the first sidewall dielectric spacers 310b, and is formed by first depositing a thick third conductive layer 311 to fill up the gaps between the first sidewall dielectric spacers 310b and then planarizing the deposited thick third conductive layer 311 using CMP with the second masking dielectric layer 307a as a polishing stop. The planarized third conductive layer 311a is preferably made of doped polycrystalline-silicon as deposited by LPCVD, and can be oxidized to form a capping poly-oxide layer (not shown). FIG. 3D also shows that a plurality of masking photoresist PR3(a)-1 is formed over the planarized third conductive layers 311a in the common-drain regions and over a part of the second masking dielectric layers 307a in nearby transistor-stack regions.

Figure 3E:
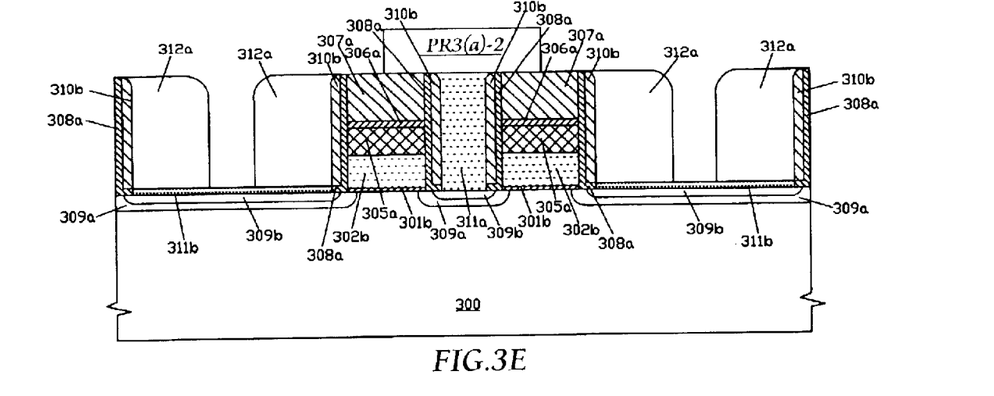

FIG. 3E shows that the planarized third conductive layers 311a over the common-source regions are etched back to form thin third conductive layers 311b and the plurality of masking photoresist PR3(a)-1 are then stripped; and subsequently, an ion-implantation (not shown) is preformed to heavily dope the planarized third conductive layers 311a and the thin third conductive layers 311b, and the rapid-thermal-annealing (RTA) process (not shown) can be performed at this stage to activate the implanted doping impurities and to eliminate the implantation-induced defects. FIG. 3E also shows that a second sidewall dielectric spacer 312a is formed over each sidewall of the first sidewall dielectric spacers 310b in the common-source regions and on the thin third conductive layers 311b to define each source region of nearby transistor-stacks, and a plurality of masking photoresist PR3(a)-2 are then formed over the same position as the plurality of masking photoresist PR3(a)-1. The second sidewall dielectric spacer 312a is preferably made of doped oxides as deposited by LPCVD and is formed by first depositing a second dielectric layer 312 over the whole structure and then etching back a thickness of the deposited second dielectric layer 312. It should be noted that the plurality of masking photoresist PR3(a)-2 are not required if a capping poly-oxide layer is formed over each of the planarized third conductive layers 311a.

Figure 3F:
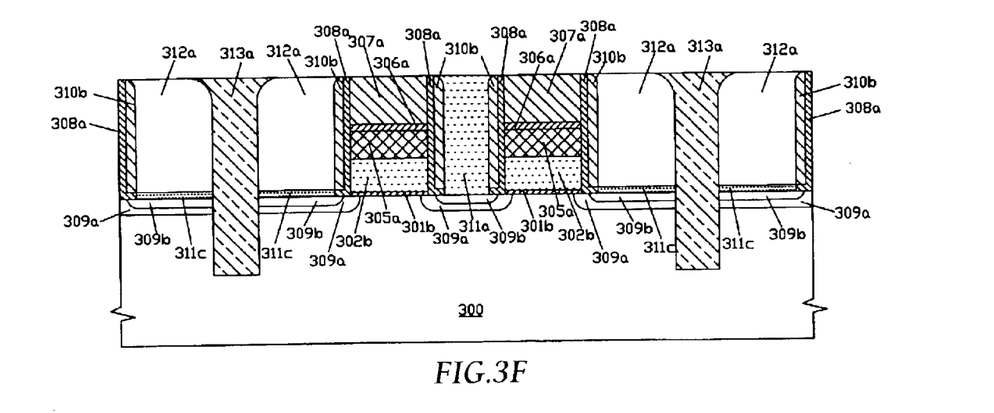

FIG. 3F shows that the thin third conductive layers 311b between the second sidewall dielectric spacers 312a are selectively removed and the semiconductor substrates 300 in the active regions are anisotropically etched to form self-aligned shallow trenches; and subsequently, the plurality of masking photoresist PR3(a)-2 are stripped. The depth of the self-aligned shallow trenches in the semiconductor substrate 300 is preferably between 3000 Angstroms and 10000 Angstroms. FIG. 3F also shows that a first planarized dielectric layer 313a is formed over each gap between the second sidewall dielectric spacers 312a and is formed by first depositing a dielectric layer 313 to fill up the gaps between the second sidewall dielectric spacers 312a and then planarizing the deposited dielectric layer 313 using CMP with the second masking dielectric layer 307a as a polishing stop or using the etching-back process. The first planarized dielectric layer 313a is preferably made of silicon-oxynitride or silicon-oxide as deposited by LPCVD.

Figure 3G:
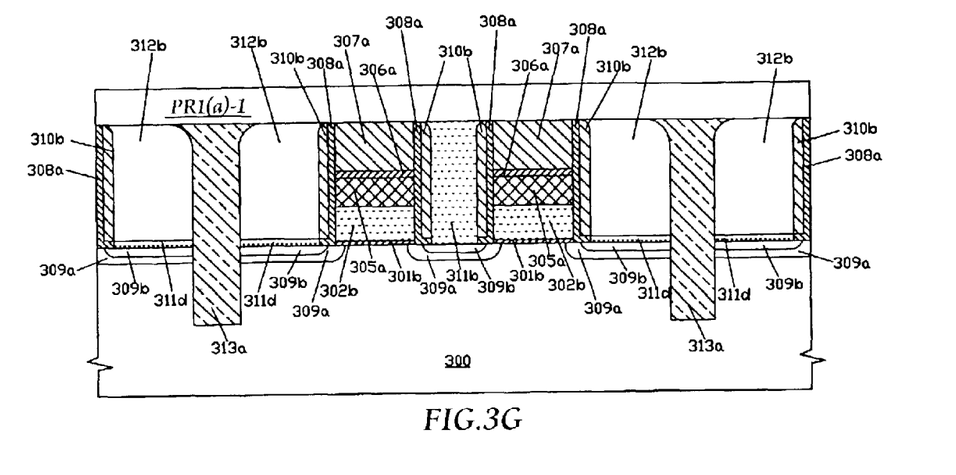

FIG. 3G shows that a plurality of masking photoresist PR1(a)-1 being aligned above the plurality of active regions are formed over a flat surface shown in FIG. 3F; and subsequently, the planarized third conductive layers 311a, the second sidewall dielectric spacers 312a, and the thin third conductive layers 311c outside of the plurality of masking photoresist PR1(a)-1 are sequentially removed by using anisotropic dry etching to form planarized third conductive islands 311b along each of the common-drain regions and second sidewall dielectric-spacer islands 312b and thin third conductive islands 311d along each of the source regions. It should be noted that the plurality of masking phororesist PR1(a)-1 can be patterned by using the same photomask used by the plurality of masking photoresist PR1.

Figure 3H:
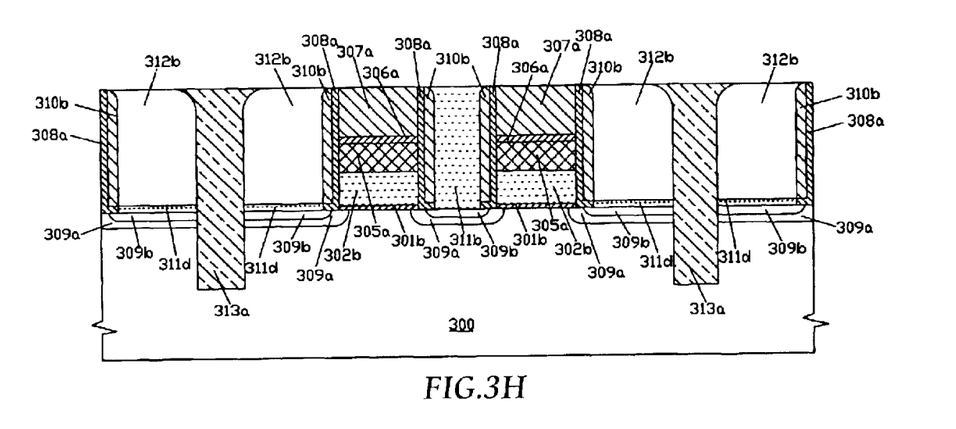

FIG. 3H shows that the plurality of masking photoresist PR1(a)-1 are stripped and the gaps formed by the process step shown in FIG. 3G are refilled with second planarized dielectric layers 313b(not shown). The second planarized dielectric layers 313b are preferably made of silicon-oxynitride or silicon-dioxide as used by the first planarized dielectric layers 313a. It is clearly seen that the second dielectric-spacer island 312b is surrounded by the first planarized dielectric layer 313a, the second planarized dielectric layers 313b, and the first sidewall dielectric spacer 310b and can be selectively removed later on to form a cavity for the formation of a DRAM capacitor over each of the source nodes 311d. It should be noted the source region and the self-aligned STI region between two source regions are defined by the spacer technique and, therefore, the common-source region as marked by $X_2F$ shown in FIG. 3A can be made to be smaller than 3F. It should be emphasized that the planarized third conductive island 311b and the thin third conductive island 311d are formed without opening the contact holes, the contact resistance and the contact integrity of shallow heavily-doped drain/source diffusion regions 309b are much improved.

Figure 4A:
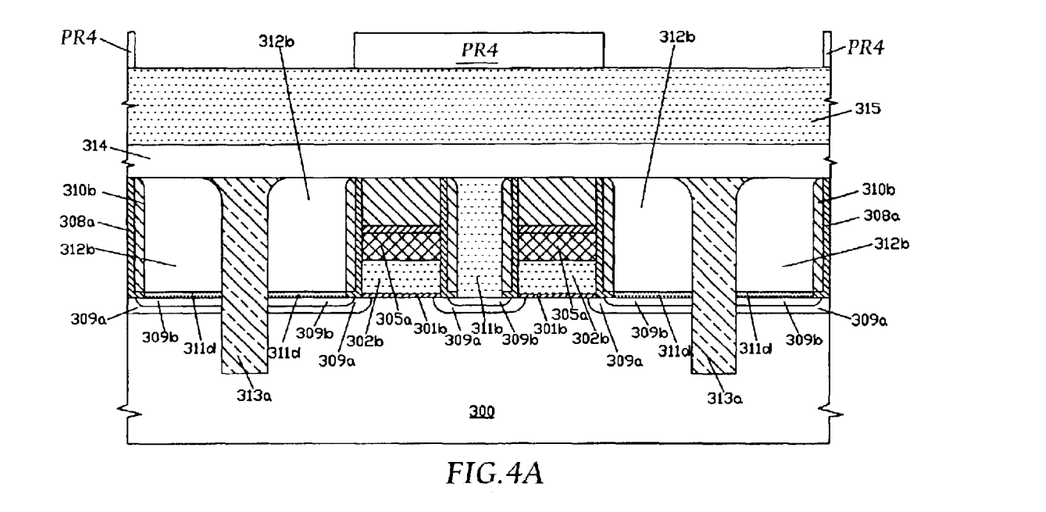
FIG. 4A through FIG. 4G show the process steps and their cross-sectional views of fabricating a DRAM capacitor structure of the present invention over the DRAM transistor structure shown in FIG. 3H.

Referring now to FIG. 4A through FIG. 4G, there are shown the process steps and their cross-sectional views of fabricating a DRAM capacitor structure over the DRAM transistor structure shown in FIG. 3H. FIG. 4A shows a first interlayer-dielectric layer 314 is formed over the DRAM transistor structure shown in FIG. 3H and a fourth conductive layer 315 is then formed over the first interlayer-dielectric layer 314; and subsequently, a plurality of masking photoresist PR4 being formed transversely to the plurality of STI regions are formed over the fourth conductive layer 315 to pattern the common-source regions (outside of PR4). The first interlayer-dielectric layer 314 is preferably made of silicon-oxide, silicon-nitride, or BP-glass as deposited by LPCVD, HDPCVD or PECVD and its thickness is preferably between 5000 Angstroms and 15000 Angstroms. The fourth conductive layer 315 is preferably made of doped polycriystalline-silicon or undoped polycrystalline-silicon as deposited by LPCVD and its thickness is preferably between 5000 Angstroms and 20000 Angstroms. It should be noted that the fourth conductive layer 315 can be replaced by a dielectric layer such as a silicon-nitride layer or the first interlayer-dielectric layer 314 can be replaced by a conductive layer such as a doped or undoped polycrystalline-silicon layer.

Figure 4B:
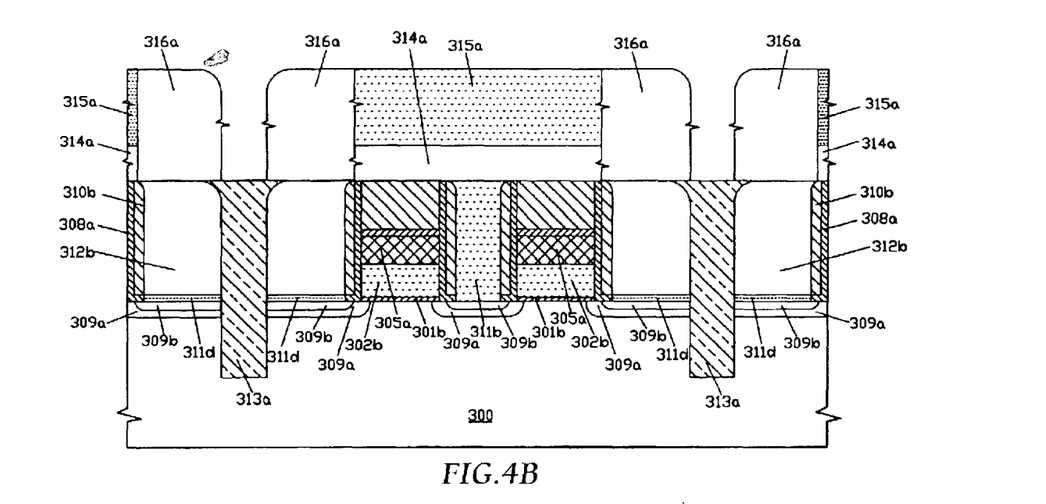

FIG. 4B shows that the fourth conductive layer 315 and the first interlayer-dielectric layer 314 outside of the plurality of masking photoresist PR4 are sequentially removed by using anisotropic dry etching and a third sidewall dielectric spacer 316a is then formed over each sidewall of the patterned structure. The third sidewall dielectric spacer 316a is preferably made of silicon-oxide or doped oxide as deposited by LPCVD and its spacer width is approximately equal to or slightly larger than that of the second sidewall dielectric spacers 312a to line with a steep portion of the first planarized dielectric layer 313a.

Figure 4C:
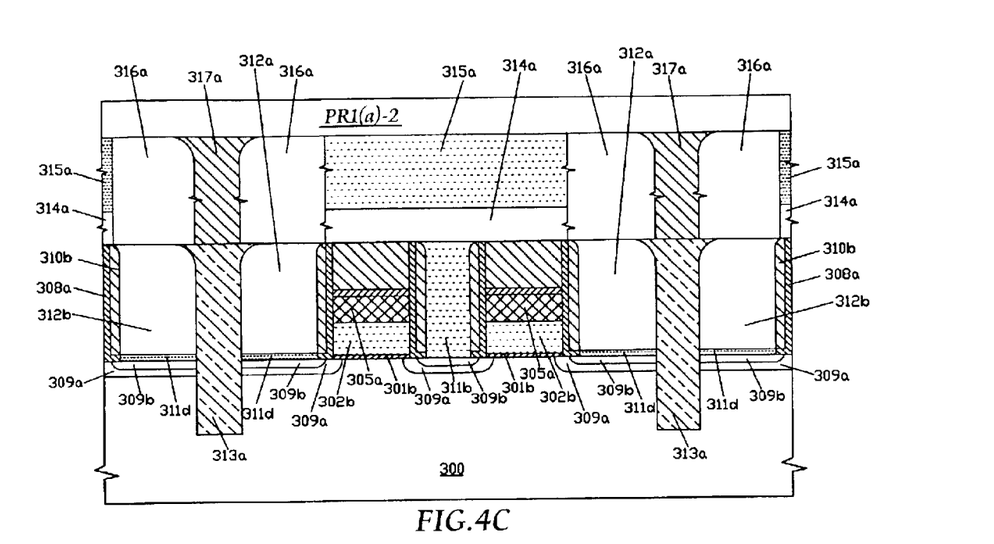

FIG. 4C shows that a third planarized dielectric layer 317a is formed between the third sidewall dielectric spacers 316a to fill up each gap formed and a plurality of masking photoresist PR1(a)-2 being aligned to the plurality of active regions are formed over the formed structure; and subsequently, the fourth conductive layers 315a, the first interlayer-dielectric layers 314a, and the third sidewall dielectric spacers 316a outside of the plurality of masking photoresist PR1(a)-2 are sequentially removed by using anisotropic dry etching.

Figure 4D:
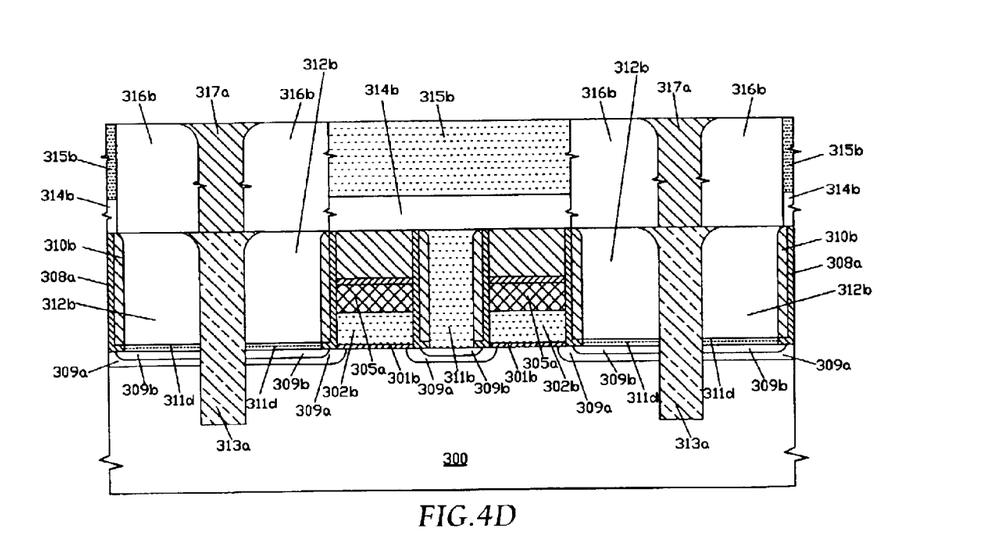

FIG. 4D shows that the plurality of masking photoresist PR1(a)-2 are stripped and a fourth planarized dielectric layer 317b is then formed to fill up each gap patterned by the plurality of masking photoresist PR1(a)-2. It is clearly seen that the plurality of masking photoresist PR1(a)-2 can be patterned by a photo-mask used for patterning the plurality of masking photoresist PR1. The third and fourth planarized dielectric layers 317a, 317b are preferably made of silicon-nitride as deposited by LPCVD. FIG. 4D also shows that the third sidewall dielectric spacers 316a are patterned to form third sidewall dielectric-spacer islands 316b and each of the third sidewall dielectric-spacer islands 316b is surrounded by the third and fourth planarized dielectric layers 317a, 317b and the fourth conductive island 315b over the first interlayer-dielectric island 314b.

Figure 4E:
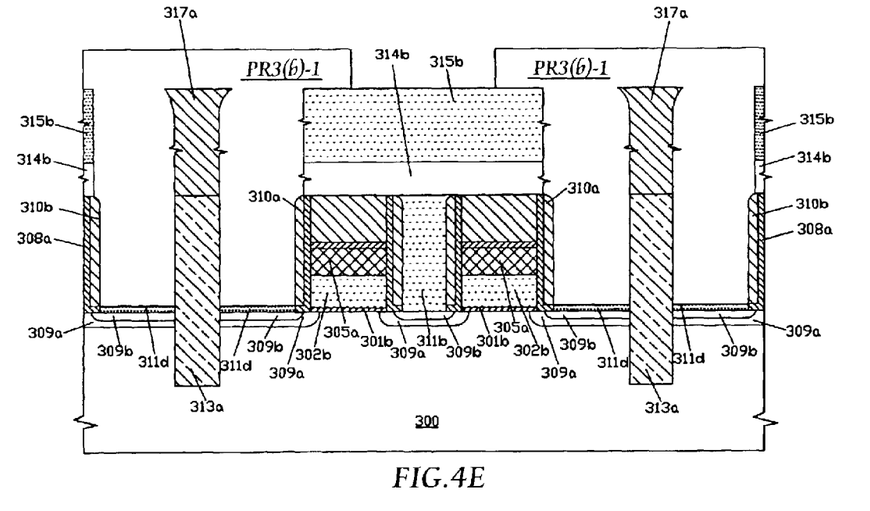

FIG. 4E shows that the third sidewall dielectric-spacer islands 316b and the second sidewall dielectric-spacer islands 312b are selectively removed by first using anisotropic dry etching and then using wet etching to form a rectangular tube-shaped cavity over each of the thin third conductive islands 311d. It is clearly seen that the curve portions of the first planarized dielectric layer 313a can be removed by wet etching. FIG. 4E also shows that a plurality of masking photoresist PR3(b)-1 being formed transversely to the plurality of STI regions are formed over the formed structure to pattern the fourth conductive layers 315b over the first interlayer-dielectric layers 314b into a plurality of fourth conductive islands 315c over first interlayer-dielectric islands 314c. The plurality of masking photoresist PR3(b)-1 can be the reverse tone of the plurality of masking photoresist PR3(a)-1 by using the same photomask.

Figure 4F:
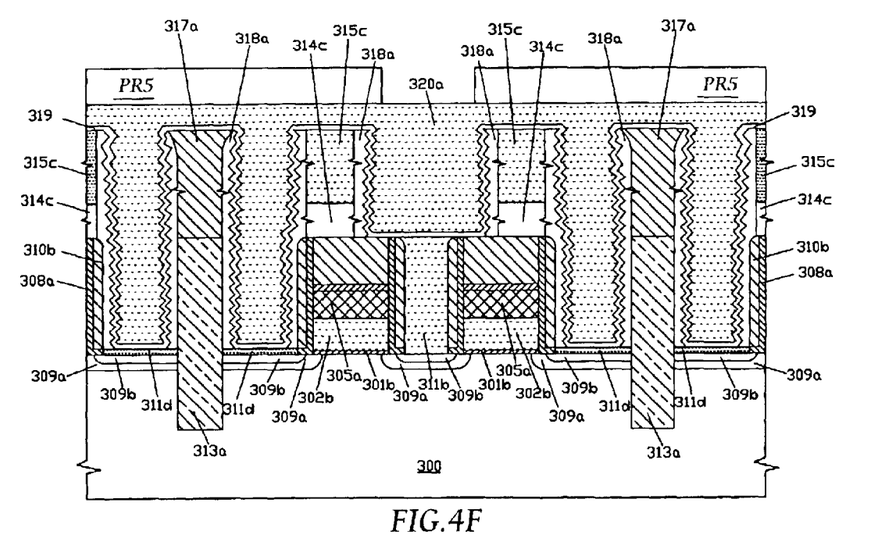

FIG. 4F shows that the fourth conductive layers 315b and the first interlayer-dielectric layers 314b outside of the plurality of masking photoresist PR3(b)-1 are sequentially removed by using anisotropic dry etching and the plurality of masking photoresist PR3(b)-1 are then stripped; a fifth conductive layer 318 (not shown) is formed over the whole structure and is then etched back to form the fifth conductive layers 318a by removing the fifth conductive layer 318 over the top surfaces of the third and fourth planarized dielectric layers 317a, 317b, the fourth conductive islands 315c, the thin third conductive islands 311d, the planarized third conductive islands 311b, and a portion of the second masking dielectric layers 307a; a capacitor-dielectric layer 319 is then formed over the whole surface; and subsequently, a planarized sixth conductive layer 320a or a sixth conductive layer 320 (not shown) is formed over the capacitor-dielectric layer 319; and a plurality of masking photoresist PR5 being formed transversely to the plurality of STI regions are formed over the planarized sixth conductive layer 320a or the sixth conductive layer 320 to define a plurality of capacitor plates 320b. The fifth conductive layer 318 comprises a doped or undoped polycrystalline-silicon layer or a rugged polycrystalline-silicon layer such as hemispherical grain polysilicon (HSG) or cylindrical grain polysilicon. The capacitor-dielectric layer 319 comprises a composite dielectric layer such as an oxide-nitride-oxide (ONO) structure or a nitride-oxide (NO) structure or comprises a high dielectric-constant (high K) insulator. The planarized sixth conductive layer 320a or a sixth conductive layer 320 is preferably made of doped polycrystalline-silicon as deposited by LPCVD.

Figure 4G:
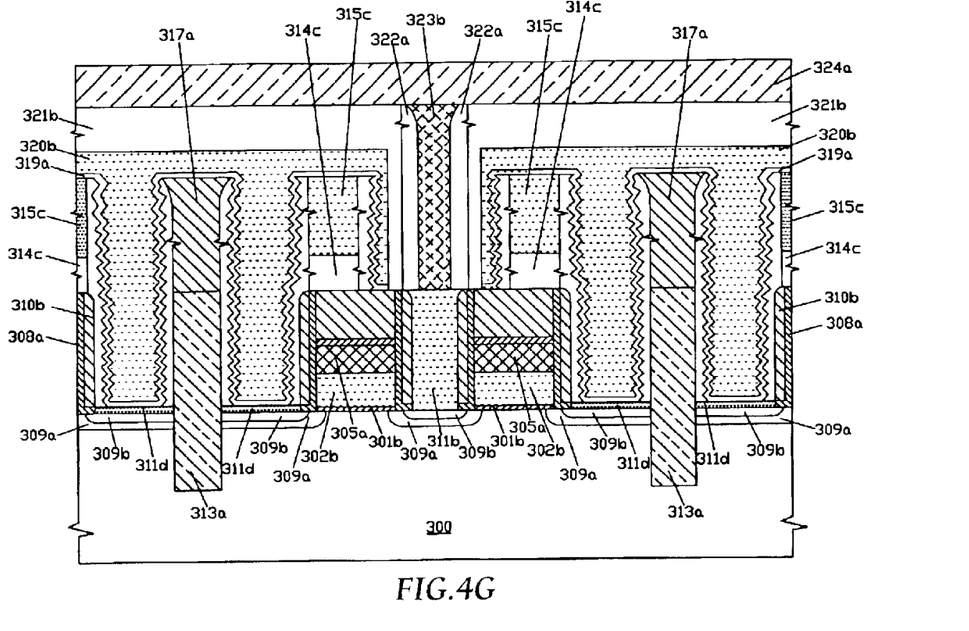

FIG. 4G shows that the planarized sixth conductive layers 320a and the capacitor-dielectric layers 319 outside of the plurality of masking photoresist PR5 are sequentially removed by anisotropic dry etching, the plurality of masking photoresist PR5 are then stripped, a planarized second interlayer-dielectric layer 321a (not shown) is formed over the whole structure to fill up the gaps formed, and a plurality of masking photoresist PR6 (not shown) are formed over the planarized second interlayer-dielectric layer 321a to form a drain contact trench over each of the common-drain regions; the planarized second interlayer-dielectric layers 321a outside of the plurality of masking photoresist PR6 are removed by anisotropic dry etching and the plurality of masking photoresist PR6 are then stripped; a fourth sidewall dielectric spacer 322a is formed over each sidewall of the patterned planarized second interlayer-dielectric layers 321b and on a portion of the planarized third conductive islands 311b and the second planarized dielectric layers 313b, a planarized first metal layer 323a (not shown) is then formed between the fourth sidewall dielectric spacers 322a and on the planarized third conductive islands 311b and the second planarizied dielectric layers 313b; a second metal layer 324 is formed over the planarized second interlayer-dielectric layers 321b and the planarized first metal layers 323a; and a masking step is applied to pattern and simultaneously etch the second metal layer 324 and the planarized first metal layers 323a to form a plurality of bit lines 324a integrated with a plurality of planarized first metal islands 323b. The planarized second interlayer-dielectric layer 321a comprises silicon-dioxide, P-glass, or BP-glass as deposited by HDPCVD or PECVD. The fourth sidewall dielectric spacer 322a is preferably made of silicon-oxide or silicon-nitride as deposited by LPCVD. The planarized first metal layer 323a comprises a tungsten layer being lined with a barrier-metal layer such as a titanium-nitride (TiN) or tantalum-nitride (TaN) layer. The second metal layer 324 comprises an aluminum layer or a copper layer. The masking step comprises a plurality of masking photoresist PR7 being aligned to the plurality of active regions by using the same mask used to form the plurality of masking photoresist PR1. The masking step also comprises a plurality of third masking dielectric layers 325a being aligned to the plurality of active regions and a sidewall dielectric spacer 326a being formed over each sidewall of the plurality of third masking dielectric layers 325a(not shown). Similarly, a plurality of contact holes can be opened through the planarized second interlayer-dielectric layer 321a to the planarized third conductive islands 311b and a planarized tungsten plug 323a lined with a barrier-metal layer is formed to fill up each of the plurality of contact holes, and a second metal layer is patterned to form a plurality of bit lines 324a being connected with a plurality of planarized tungsten plugs 323a.

It should be noted that the thicknesses of the first interlayer-dielectric layer 314 and the planarized fourth conductive layer 315 are used to adjust the height and the periphery area of a DRAM capacitor and the DRAM capacitor can also be optimized by the surface area of the thin third conductive island 311d formed over the heavily-doped source diffusion region 309b.

Accordingly, the features and advantages of the DRAM transistor structure and the DRAM capacitor structure of the present invention are summarized below:

(a) The DRAM transistor structure of the present invention offers a semiconductor surface area smaller than $6F^2$ for a DRAM cell.
(b) The DRAM transistor structure of the present invention offers raised conductive islands over shallow heavily-doped source/drain diffusion regions being formed within lightly-doped source/drain diffusion regions to improve the contact resistance and the contact integrity of shallow source/drain junction depth and further to alleviate the punch-through effect and the hot-electron reliability of a DRAM transistor.
(c) The DRAM transistor structure of the present invention offers a shallow-trench-isolation structure to eliminate the field-emission current between the trench corners in the channel-width direction and the conductive-gate layer without sacrificing the active area.
(d) The DRAM transistor structure of the present invention offers a self-aligned conductive source node over the shallow heavily-doped source diffusion region for forming a DRAM capacitor.
(e) The DRAM capacitor structure of the present invention offers a rectangular tube-shaped cavity integrated with a rectangular conductive island for forming a high-capacity DRAM capacitor.
(f) The DRAM memory structure of the present invention offers a planarized third conductive island over each of shallow heavily-doped drain diffusion regions for forming a contactless bit-line node.

While the present invention has been particularly shown and described with reference to the present examples and embodiments as considered as illustrative and not restrictive. Moreover, the present invention is not to be limited to the details given herein, it will be understood by those skilled in the art that various changes in form and details may be made without departure from the true spirit and scope of the invention.

What is claimed is:

1. A DRAM transistor structure comprising:

a semiconductor substrate of a first conductivity type;

a shallow-trench-isolation (STI) structure having an active region sandwiched by two parallel STI regions being formed over said semiconductor substrate;

a transistor-stack being formed transversely across a portion of said active region and said two parallel STI regions, wherein said transistor-stack comprises a second masking dielectric layer over a capping-oxide layer being formed on an elongated second conductive layer with said elongated second conductive layer being formed on a first conductive layer over a gate-dielectric layer in said active region and over two first raised field-oxide layers in said two parallel STI regions;

a common-drain region being located in a side portion of said transistor-stack comprising: a first sidewall dielectric spacer being formed over a sidewall of said transistor-stack and on a portion of a second flat bed being formed by two third raised field-oxide layers in said two parallel STI regions and a common-drain diffusion region of a second conductivity type in said active region, and a planarized third conductive island being formed on said common-drain diffusion region outside of said first sidewall dielectric spacer and between two second planarized dielectric layers being formed over said two third raised field-oxide layers in said two parallel STI regions;

a common-source region being located in another side portion of said transistor-stack comprising: two source regions and one isolation region being located between said two source regions, wherein said isolation region comprises a self-aligned shallow trench in said semiconductor substrate to electrically isolate said two source regions with a first planarized dielectric layer being formed over said self-aligned shallow trench in said active region and on said two third raised field-oxide layers in said two parallel STI regions; and each of said two source regions being formed near said transistor-stack comprising said first sidewall dielectric spacer being formed over another sidewall of said transistor-stack and on a portion of a first flat bed being formed by a source diffusion region of said second conductivity type in said active region and said two third raised field-oxide layers in said two parallel STI regions, a thin third conductive island being formed on said source diffusion region between said first sidewall dielectric spacer and said first planarized dielectric layer, and a second sidewall dielectric-spacer island being formed on said thin third conductive island in said active region and between said two second planarized dielectric layers in said two parallel STI regions.

2. The DRAM transistor structure according to claim 1, wherein said first planarized dielectric layer and said two second planarized dielectric layers are preferably made of a dielectric material comprising silicon-dioxide or silicon-oxynitride.

3. The DRAM transistor structure according to claim 1, wherein said first sidewall dielectric spacer and said second masking dielectric layer are preferably made of a dielectric material comprising silicon-nitride.

4. The DRAM transistor structure according to claim 1, wherein said planarized third conductive island and said thin third conductive island are preferably made of a conductive material comprising doped polycrystalline-silicon and are further heavily implanted with doping impurities of said second conductivity type.

5. The DRAM transistor structure according to claim 1, wherein said second sidewall dielectric-spacer island is preferably made of doped oxide and is used as an etching mask for simultaneously defining said self-aligned shallow trench, said first planarized dielectric layer, and said thin third conductive island.

6. The DRAM transistor structure according to claim 1, wherein said first conductive layer is preferably made of doped polycrystalline-silicon or doped amorphous-silicon and said elongated second conductive layer being acted as a word line is preferably made of tungsten or tungsten-silicide.

7. A DRAM capacitor structure comprising:
a DRAM transistor structure being formed over a shallow-trench-isolation (STI) structure having an active region isolated by two parallel STI regions formed on a semiconductor substrate of a first conductivity type, wherein a transistor-stack comprising an elongated second conductive layer having a second masking dielectric layer over a capping-oxide layer formed thereon is formed over a flat surface being formed by a first conductive layer over a gate-dielectric layer in said active region and over two first raised field-oxide layers in said two parallel STI regions;

a rectangular tube-shaped cavity being formed over a thin third conductive island on a source diffusion region of a second conductivity type, wherein a first side of said rectangular tube-shaped cavity is formed by a first sidewall dielectric spacer being formed over a sidewall of said transistor-stack and a fourth conductive island on a first interlayer-dielectric island being at least formed on a portion of said transistor-stack in said active region; a second side of said rectangular tube-shaped cavity being an opposite side of said first side is formed by a third planarized dielectric layer on a first planarized dielectric layer; and a third side and a fourth side of said rectangular tube-shaped cavity are separately formed by a fourth planarized dielectric layer over a second planarized dielectric layer in each of said two parallel STI regions;

a fifth conductive layer being formed over an inner sidewall of said rectangular tube-shaped cavity and an outer sidewall of said fourth conductive island over said first interlayer-dielectric island;

a capacitor-dielectric layer being formed at least over said thin third conductive island, said fifth conductive layer, and said fourth conductive island over said first interlayer-dielectric island;

a sixth conductive layer or a planarized sixth conductive layer being formed over said capacitor-dielectric layer and being patterned to act as a capacitor plate;

a planarized conductive contact-plug or a planarized conductive contact-island being formed on a planarized third conductive island; and a metal layer being patterned to be aligned above said active region and connected with said planarized conductive contact-plug or said planarized conductive contact-island to act as a bit line.

8. The DRAM capacitor structure according to claim 7, wherein said fourth conductive island is preferable made of doped or undoped polycrystalline-silicon and said fifth conductive layer is preferably a doped polycrystalline-silicon layer or a rugged polycrystalline-silicon layer such as a hemispherical grain (HSG) polycrystalline-silicon layer or a cylindrical grain polycrystalline-silicon layer.

9. The DRAM capacitor structure according to claim 7, wherein said capacitor-dielectric layer is preferably a composite dielectric layer such as an oxide-nitride-oxide (ONO) structure or a nitride-oxide structure or is preferably a high dielectric-constant (high K) insulator.

10. The DRAM capacitor structure according to claim 7, wherein said third planarized dielectric layer and said fourth planarized dielectric layer are preferably made of a dielectric material comprising silicon-nitride or silicon-oxynitride.

11. The DRAM capacitor structure according to claim 7, wherein said first planarized dielectric layer and said second planarized dielectric layer are preferably made of a dielectric material comprising silicon-dioxide or silicon-oxynitride.

12. The DRAM capacitor structure according to claim 7, wherein said planarized third conductive island and said thin third conductive island are preferably made of doped polycrystalline-silicon and are further implanted with doping impurities of said second conductivity type.

13. A method of forming a DRAM memory, comprising the steps of:
providing a semiconductor substrate of a first conductivity type;
forming a shallow-trench-isolation (STI) structure having a plurality of parallel STI regions and a plurality of active regions formed alternatively on said semiconductor substrate, wherein each of the plurality of parallel STI regions is filled with a first raised field-oxide layer and each of the plurality of active regions comprises a first conductive layer being formed on a gate-dielectric layer;
forming a second conductive layer, a capping-oxide layer, and a second masking dielectric layer sequentially over said STI structure to form a multilayer-gate structure;

patterning said multilayer-gate structure using a plurality of masking photoresist (PR2) to define a plurality of transistor-stacks and a plurality of common-source and common-drain regions transversely to the plurality of active regions;

removing sequentially said second masking dielectric layer, said capping-oxide layer, said second conductive layer outside of the plurality of masking photoresist PR2, etching selectively said first raised field-oxide layers to a depth equal to a thickness of said first conductive layer to form second raised field-oxide layers, removing selectively said first conductive layers, removing selectively said gate-dielectric layers and etching simultaneously said second raised field-oxide layers to form third raised field-oxide layers for forming a plurality of transistor-stacks, a first flat bed over each of the plurality of common-source regions, and a second flat bed over each of the plurality of common-drain regions, wherein said first/second flat beds are alternately formed by said semiconductor substrate in said active region and said third raised field-oxide layer in said parallel STI region;

forming a buffer-dielectric layer over the plurality of transistor-stacks, said first flat beds, and said second flat beds and implanting doping impurities in a self-aligned manner across said buffer-dielectric layer into said semiconductor substrate of the plurality of active regions to form lightly-doped common-source and drain diffusion regions of a second conductivity type;

forming a first sidewall dielectric spacer over a sidewall of said buffer-dielectric layer and implanting doping impurities in a self-aligned manner across said buffer-dielectric layer into said semiconductor substrate of the plurality of active regions to form heavily-doped common-source and drain diffusion regions of said second conductivity type within said lightly-doped common-source and drain diffusion regions;

etching back selectively a thickness of said buffer-dielectric layer and simultaneously etching said first sidewall dielectric spacers to expose said first flat beds and said second flat beds outside of said first sidewall dielectric spacers;

forming a planarized third conductive layer to fill up a gap between said first sidewall dielectric spacers and on said heavily-doped common-source/drain diffusion regions and said third raised field-oxide layers;

etching back selectively said planarized third conductive layers in each of the plurality of common-source regions by using a non-critical masking photoresist step (PR3(a)-1) to form a thin third conductive layer over each of said first flat beds between said first sidewall dielectric spacers;

forming a second sidewall dielectric spacer over a sidewall of said first sidewall dielectric spacers in each of the plurality of common-source regions and on a portion of said thin third conductive layer to define a source region for each of the plurality of transistor-stacks and simultaneously to define an isolation space between said source regions in each of the plurality of common-source regions;

removing selectively said thin third conductive layer between said second sidewall dielectric spacers and etching anisotropically said semiconductor substrate in a self-aligned manner to form a plurality of self-aligned shallow trenches between said second sidewall dielectric spacers;

forming a first planarized dielectric layer between said second sidewall dielectric spacers to simultaneously fill up each of the plurality of self-aligned shallow trenches;

removing selectively said planarized third conductive layers, said second sidewall dielectric spacers, and said thin third conductive layers outside of the plurality of active regions by using a photo-mask for forming said STI structure to form planarized third conductive islands, second sidewall dielectric-spacer islands, and thin third conductive islands;

forming second planarized dielectric layers to fill up gaps outside of the plurality of active regions for forming a DRAM transistor structure; and forming a DRAM capacitor structure over said DRAM transistor structure, wherein a rectangular tube-shaped cavity is formed over each of said thin third conductive islands for forming a DRAM capacitor and a planarized conductive contact-plug or a planarized conductive contact-island is formed over each of said planarized third conductive islands to act as a bit-line node for forming a plurality of bit lines being connected with said planarized conductive contact-plugs or said planarized conductive contact-islands.

14. The method according to claim 13, wherein said DRAM capacitor structure is formed by the steps comprising:

forming sequentially a first interlayer-dielectric layer and a fourth conductive layer over said DRAM transistor structure;

patterning and removing selectively said fourth conductive layer and said first interlayer-dielectric layer using a masking photoresist step to open a source trench over each of the plurality of common-source regions;

forming a third sidewall dielectric spacer over a sidewall of said source trenches and on said second sidewall dielectric-spacer islands, said second planarized dielectric layers, and a corner portion of said first planarized dielectric layers;

forming a third planarized dielectric layer to fill up a gap between said third sidewall dielectric spacers and on said first planarized dielectric layer in each of the plurality of common-source regions;

removing selectively said fourth conductive layers, said first interlayer-dielectric layers, and said third sidewall dielectric spacers outside of the plurality of active regions by using said photo-mask for forming said STI structure to form fourth conductive islands over first interlayer-dielectric islands and third sidewall dielectric-spacer islands;

forming fourth planarized dielectric layers to fill up gaps outside of the plurality of active regions;

removing selectively said third sidewall dielectric-spacer islands and said second sidewall dielectric-spacer islands and simultaneously removing said corner portion of said first planarized dielectric layers to form said rectangular tube-shaped cavity over each of said thin third conductive islands;

patterning and sequentially etching said fourth conductive islands and said first interlayer-dielectric islands into a separate raised island over a portion of each of separate transistors by using a masking photoresist step (PR3 (b)-1);

forming a fifth conductive layer over an exposed structure surface and etching back a thickness of said fifth conductive layer to remove said fifth conductive layer over top and bottom surface of said exposed structure surface;

forming a capacitor-dielectric layer over another exposed structure surface;

forming a sixth conductive layer or a planarized sixth conductive layer over said capacitor-dielectric layer;

patterning and removing said sixth conductive layer or said planarized sixth conductive layer and said capacitor-dielectric layer over each of said common-drain regions and a portion of nearby transistor-stacks by a masking photoresist step (PR5) to form a plurality of parallel capacitor plates transversely to the plurality of active regions;

forming a planarized second interlayer-dielectric layer over a formed structure surface;

forming said planarized conductive contact-plug or said planarized conductive contact-island on each of said planarized third conductive islands; and forming the plurality of bit lines being aligned above the plurality of active regions and connected to said planarized conductive contact-plugs or said planarized conductive contact-islands.

15. The method according to claim 13, wherein said first planarized dielectric layer and said second planarized dielectric layer are preferably made of a dielectric material comprising silicon-oxynitride or silicon-dioxide.

16. The method according to claim 14, wherein said third planarized dielectric layer and said fourth planarized dielectric layer are preferably made of a dielectric material comprising silicon-nitride or silicon-oxynitride.

17. The method according to claim 14, wherein said planarized third conductive island and said thin third conductive island are preferably made of doped polycrystalline-silicon and are further heavily implanted with doping impurities of said second conductivity type.

18. The method according to claim 14, wherein said fifth conductive layer is preferably a doped polycrystalline-silicon layer or a rugged polycrystalline-silicon layer such as a hemispherical grain (HSG) polycrystalline-silicon layer or a cylindrical grain polycrystalline-silicon layer.

19. The method according to claim 14, wherein said capacitor-dielectric layer is preferably a composite dielectric layer such as an oxide-nitride-oxide structure or a nitride-oxide structure or is preferably a high dielectric-constant (high K) insulator.

20. The method according to claim 14, wherein said planarized conductive contact-island is formed by the steps comprising;

patterning and removing said planarized second interlayer-dielectric layer using a masking photoresist step to form a drain contact trench over each of the plurality of common-drain regions;

forming a fourth sidewall dielectric spacer over a sidewall of said drain contact trench;

forming a planarized conductive contact layer lined with a barrier-metal layer between said fourth sidewall dielectric spacers and on said planarized third conductive islands and said second planarized dielectric layers;

forming a metal layer over said planarized second interlayer-dielectric layers, said fourth sidewall dielectric spacers, and said planarized conductive contact layers; and patterning and removing simultaneously said metal layer and said planarized conductive contact layers outside of the plurality of active regions by using said photo-mask for forming said STI structure to form the plurality of bit lines integrated with said planarized conductive contact-islands.

* * * * *